United States Patent
Linder et al.

(10) Patent No.: US 6,693,980 B1
(45) Date of Patent: Feb. 17, 2004

(54) WIDEBAND FAST-HOPPING RECEIVER FRONT-END AND MIXING METHOD

(75) Inventors: Lloyd F. Linder, Agoura Hills, CA (US); Don C. Devendorf, Carlsbad, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 526 days.

(21) Appl. No.: 09/664,298

(22) Filed: Sep. 18, 2000

(51) Int. Cl.[7] .............................................. H04L 27/22
(52) U.S. Cl. ....................... 375/329; 375/327; 375/332; 329/304
(58) Field of Search ............................... 375/279–281, 375/283, 326, 327, 329–332, 344, 345; 329/304, 307, 308; 327/105, 106, 107; 455/192.2, 205, 208, 209, 260

(56) References Cited

U.S. PATENT DOCUMENTS

| | | | |
|---|---|---|---|
| 4,924,188 A | * 5/1990 | Akazawa et al. | 327/248 |
| 5,063,348 A | * 11/1991 | Kuhara et al. | 324/307 |
| 5,172,394 A | * 12/1992 | Kuster et al. | 375/298 |
| 5,483,550 A | 1/1996 | Hulbert | |
| 5,528,633 A | * 6/1996 | Halik et al. | 375/326 |
| 5,606,731 A | * 2/1997 | Pace et al. | 455/260 |
| 5,633,898 A | * 5/1997 | Kishigami et al. | 375/344 |
| 5,703,527 A | * 12/1997 | Iwasaki | 329/336 |
| 5,878,335 A | 3/1999 | Kushner | |
| 5,886,752 A | 3/1999 | Cross | |
| 5,970,053 A | * 10/1999 | Schick et al. | 370/252 |
| 6,054,948 A | 4/2000 | Dean | |
| 6,240,122 B1 | * 5/2001 | Miyashita | 375/130 |

OTHER PUBLICATIONS

Design of a 2.4 GHz CMOS Frequency–Hopped RF Transmitter IC, Marko Kosunen, Jouko Vankka, Mikko Waltari, Lauri Sumanen, Kimmo Koli, Kari Halonen, Electronic Design Laboratory, Helsinki University of Technology.
*High Speed Design Techniques*, Analog Devices, Inc. (1996), pp. 6–2 to 6–4 and 6–7 to 6–8.

* cited by examiner

*Primary Examiner*—Young T. Tse
(74) *Attorney, Agent, or Firm*—Morrison & Foerster LLP

(57) ABSTRACT

A wideband fast-hopping receiver front-end uses direct digital synthesis (DDS) to provide quadrature LO signals to the front-end's mixers. A DDS circuit stores multiple digital word sequences which represent desired waveforms, and outputs desired sequence pairs to a pair of DACs in response to a clock signal and a command signal. The DACs convert the sequences to analog signals, which are filtered and squared as necessary to provide quadrature LO signals to the mixers. Frequency hopping is accomplished by changing the command signal, which causes a different pair of sequences to be output and the frequency of the LO signals provided to the mixers to be changed. Active image rejection is combined with DDS LO generation to provide faster frequency hopping. The front-end is combined with an ADC and a communications signal processor to provide a complete system, all of which can be integrated together on a common substrate.

22 Claims, 4 Drawing Sheets

WIDEBAND FAST-HOPPING RECEIVER FRONT-END AND MIXING METHOD

BACKGROUND OF THE INVENTION

1. Field of the Invention

This invention relates to mixing circuits and methods, particularly for receivers handling fast-hopping frequencies.

2. Description of the Related Art

Many modern communications systems employ the concept of "frequency hopping", in which the frequency of a transmitted signal is changed at a rapid rate. This requires the receiver in such a system to have a wide bandwidth, and to be able to tune to a new frequency quickly and accurately.

One type of front-end used in such a frequency-hopping receiver is shown in FIG. 1. A pair of mixers 10 and 11 receive an incoming radio frequency (RF) signal $RF_{in}$ at respective first inputs, and local oscillator (LO) signals 12 and 13 at respective second inputs; LO signals 12 and 13 are separated in phase by 90°. Mixers 10 and 11 produce respective outputs which contain components derived from the sum of and the difference between the mixer's input signals. The outputs of mixers 10 and 11 are typically passed through respective low-pass filters 14 and 16 to remove the sum components. The filtered output of mixer 10 is passed through another 90° phase shifter 18, and the outputs of shifter 18 and mixer 11 are added together using a summing circuit 20 to produce an intermediate frequency (IF) output $IF_{out}$. The 90° between LO signals and the 90° phase shift provided by phase shifter 18 are used to suppress response at the "image" frequency, which is given by LO−IF when RF>LO and RF−LO=IF, and given by LO+IF when RF<LO and LO−RF=IF.

The front-end is tuned to a specific RF frequency by providing LO signals of the appropriate frequency. Conventionally, the LO signals are provided by a low phase noise phase-locked loop (PLL) circuit 24, which receives a fixed input frequency $f_{crystal}$ and multiplies it up to the necessary LO frequency. To accommodate different incoming RF frequencies, PLL 24 typically includes a divide-by-N counter 26 in its loop. The value of N is made changeable by means of a digital command, with different LO frequencies provided by commanding different N values. The PLL output sin $\omega_{LO}t$ is passed through a 90° phase shifter 28 to provide a signal cos $\omega_{LO}t$, and both sin $\omega_{LO}t$ and cos $\omega_{LO}t$ are passed through respective squaring circuits 30 and 32 to provide the quadrature LO signals 13 and 12, respectively.

Unfortunately, a PLL is ill-suited for use in a wideband receiver which must accommodate rapid frequency hopping. The 0° and 90° LO signals are typically generated using either a ring oscillator VCO that produces quadrature outputs, or (as shown in FIG. 1) an LC-VCO whose output goes through a 90° phase shift network. Both of these approaches are inherently narrowband, however, and do not accommodate image rejection over a wide bandwidth as is required by current and future wireless communications systems. Additionally, the acquisition settling time of a wideband, low phase noise PLL is on the order of microseconds, which may be too slow to accommodate fast-hopping hopping schemes.

SUMMARY OF THE INVENTION

A wideband fast-hopping receiver front-end and mixing method are presented which overcome the problems noted above, providing a wideband RF receiver front-end with extremely fast frequency hopping capability.

Direct digital synthesis (DDS) is used to provide the quadrature LO signals to the front-end's mixers. DDS circuits operate by storing one or more sequences of digital words, each of which represents a desired waveform. In response to a clock signal and a command signal, a sequence is output to a digital-to-analog converter (DAC), which converts the digital word sequence to the desired waveform. In the present application, a DDS circuit stores pairs of digital word sequences; one sequence of each pair corresponds to the in-phase LO signal and the other sequence corresponds to the quadrature LO signal. Each stored sequence pair represents in-phase and quadrature LO signals at a particular frequency, and a particular pair of sequences is output to the DACs in response to the clock signal, which is preferably generated with a narrowband PLL, and the command signal. Frequency hopping is accomplished by changing the command signal, which causes a different pair of sequences to be output and the frequency of the LO signals provided to the mixers to be changed. The described method of generating quadrature LO signals is inherently wideband, and provides reduced phase noise in comparison with PLL-based circuits, due to the fixed DDS clock frequency generated by the narrowband PLL. Phase noise of the DACs is limited only by the process technology used (preferably bipolar). Furthermore, the settling time of a DDS circuit is several orders of magnitude less than for a PLL, such that the present invention provides much faster frequency-hopping capability which lends itself to a monolithic solution.

Active image rejection is preferably combined with the DDS LO generation to provide faster frequency hopping. The front-end can be combined with an analog-to-digital converter (ADC) and a communications signal processor to provide a complete system, all of which can be integrated together on a common substrate.

Further features and advantages of the invention will be apparent to those skilled in the art from the following detailed description, taken together with the accompanying drawings.

DETAILED DESCRIPTION OF THE INVENTION

Figure 1:
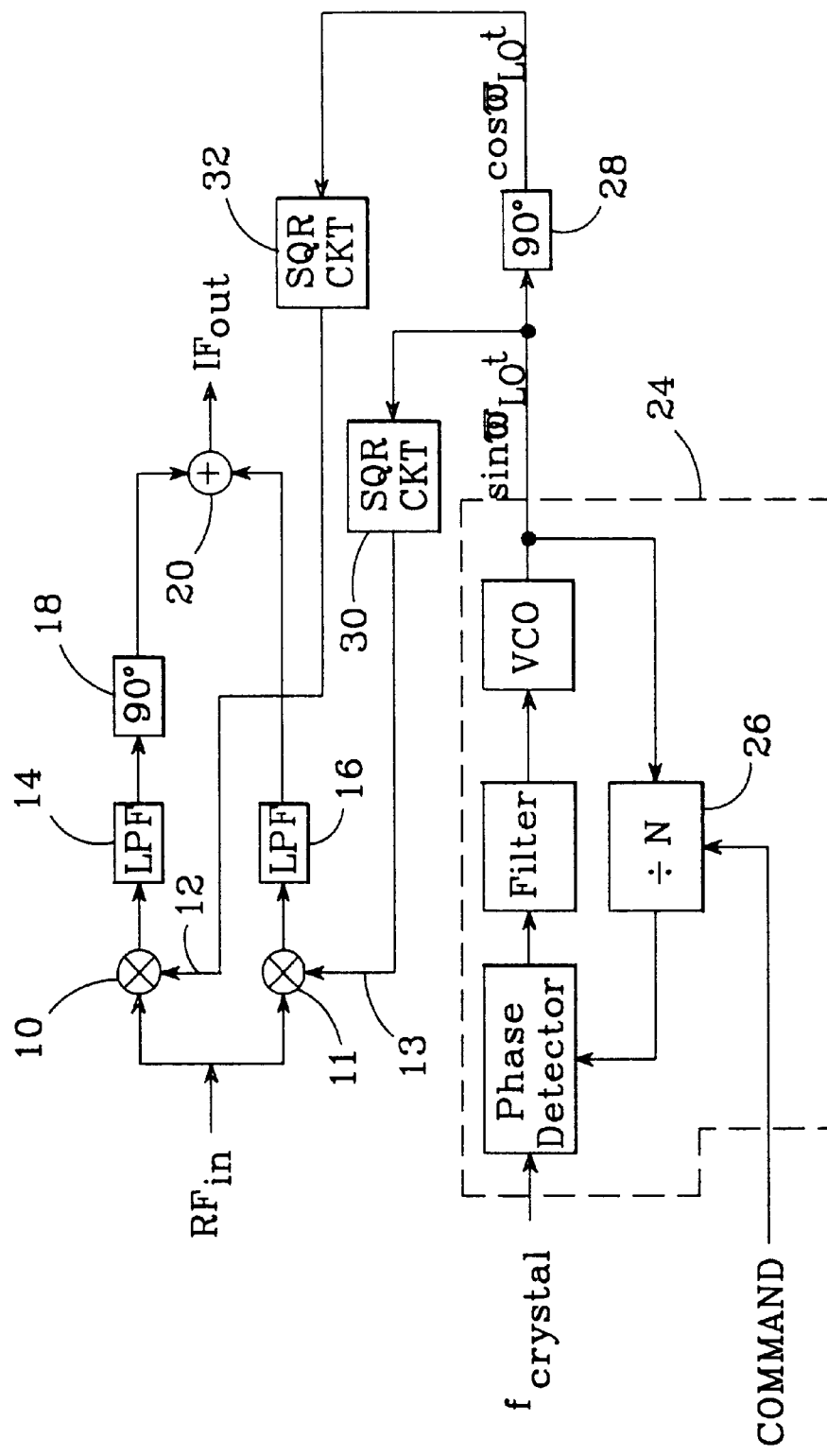
FIG. 1 is a block diagram of the front-end of a known frequency-hopping receiver.
Figure 2:
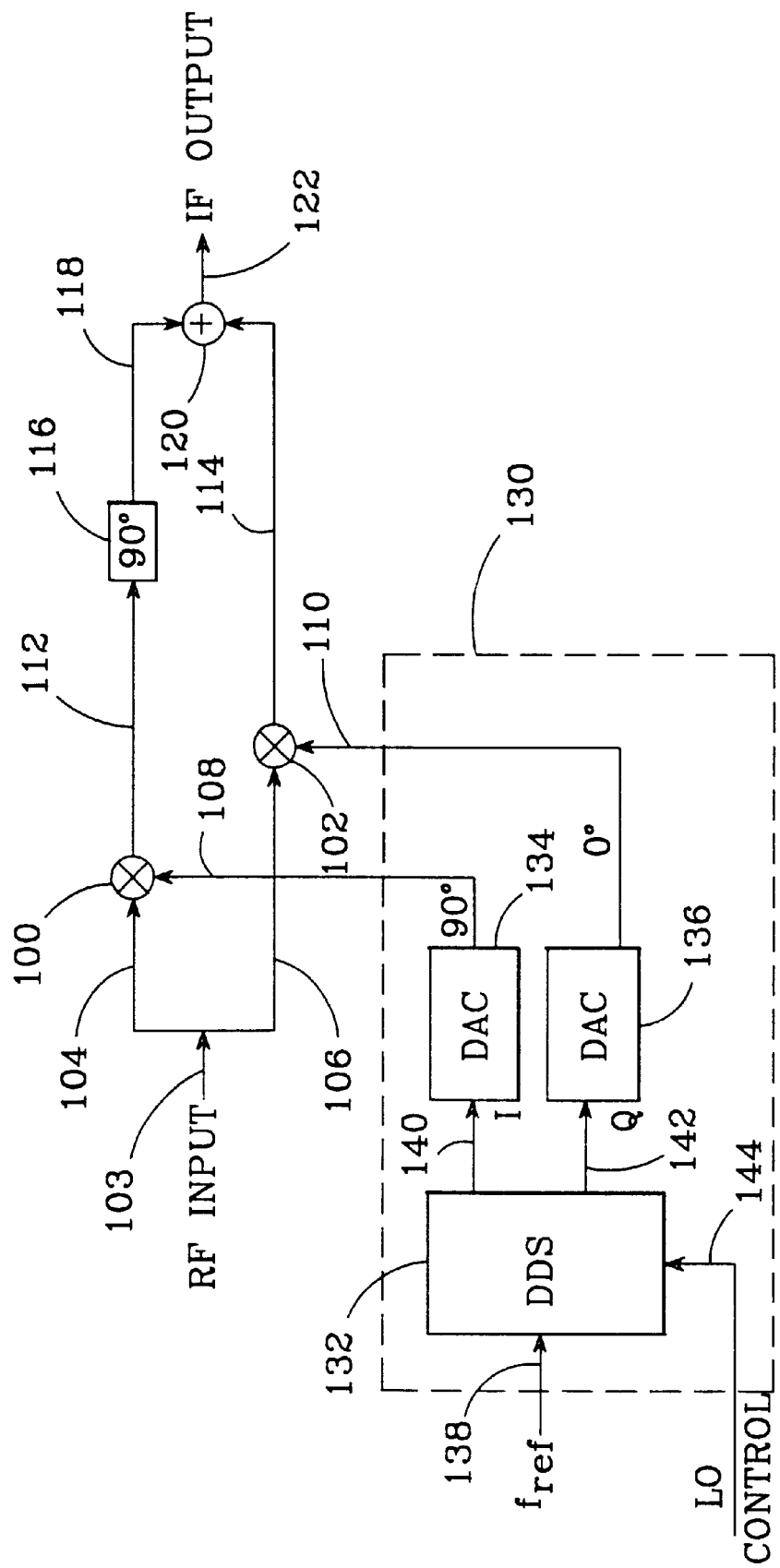
FIG. 2 is a block diagram of the front-end of a frequency-hopping receiver per the present invention.

The basic principles of the invention are illustrated in FIG. 2. A pair of mixers 100 and 102, preferably Gilbert mixers, receive an RF input signal 103 at inputs 104 and 106, respectively, and a pair of quadrature LO signals at inputs 108 (90°) and 110 (0°), respectively. Mixers 100 and 102 produce respective outputs 112 and 114, with mixer output 112 containing components of the sum and difference of inputs 104 and 108, and mixer output 114 containing components of the sum and difference of inputs 106 and 110. At least one phase shift network 116 is connected so as to introduce a 90° phase difference between the mixer outputs; in FIG. 2, the output 118 of phase shift network 116 and mixer output 114 are separated by 90°. The resulting mixer outputs (118, 114) are summed with a summing circuit 120 to produce an IF output 122.

A LO generating circuit 130 provides LO signals 108 and 110 to mixers 100 and 102, respectively. Circuit 130 includes a DDS circuit 132 and a pair of DACs 134 and 136. As noted above, a DDS circuit stores one or more digital word sequences, each of which represents a desired waveform; a selected sequence of words is clocked out in response to a clock signal. DDS circuit 132 receives a clock signal $f_{ref}$ at an input 138, and produces sequences of digital words at two outputs 140 and 142. In this application, DDS 132 is required to store and output two distinct digital word sequences: one which represents the in-phase (I) LO signal (produced at output 140) and one which represents the quadrature (Q) LO signal (produced at output 142). The sequence of digital words produced at DDS output 140 is connected to the digital input of DAC 134 to produce 90° LO signal 108, and the sequence of digital words produced at DDS output 142 is connected to the digital input of DAC 136 to produce 0° LO signal 110.

The present invention is for use in a frequency-hopping receiver front-end application. As such, DDS 132 is also required to have a command input 144, and to store multiple pairs of digital word sequences, with each pair of sequences representing in-phase and quadrature LO signals at a particular frequency. For example, DDS 132 may store 3 pairs of digital word sequences, representing I and Q LO signals at 300, 1000, and 3000 MHz, respectively. A desired LO frequency is selected using command signal 144, which acts to output a corresponding sequence pair at outputs 140 and 142.

Use of a LO generating circuit 130 as described herein provides a number of advantages over prior art frequency-hopping front-ends. With different LO frequencies accommodated by simply storing different digital word sequences in DDS 132, this approach is inherently wideband. Settling time is also vastly reduced when compared with PLL generation of the LO signals; only the settling time of the DACs need be accommodated within the period of the DDS clock $f_{ref}$. With settling time typically reduced by 3–4 orders of magnitude, hopping speed is significantly increased. Phase noise is also reduced in comparison to that produced by a PLL employed in a wideband frequency-hopping receiver.

DDS 132 is preferably a single circuit designed to produce both of the digital word sequences at outputs 140 and 142 simultaneously, though separate DDS devices dedicated to the I and Q digital word sequences may also be employed. As the DDS is being employed in a frequency-hopping application, it must be capable of storing multiple pairs of digital word sequences, with a command input used to select a particular sequence pair for output. DDS circuits are well-known, and are discussed, for example, in *High Speed Design Techniques*, Analog Devices, Inc. (1996), pp. 6-2 to 6-4 and 6-7 to 6-8.

The pairs of digital word sequences output by DDS 132 are arranged such that a pair of periodic waveforms are produced by DACs 134 and 136. Mixers 100 and 102 are typically designed to receive square wave LO signals. One way to accommodate this is for DDS 132 to store digital word sequences that result in square waves being produced by DACs 134 and 136. Preferably, however, the words stored in DDS 132 are arranged to produce sinusoidal outputs from DACs 134 and 136, which are passed through squaring circuits to produce the necessary square waves.

Figure 3:
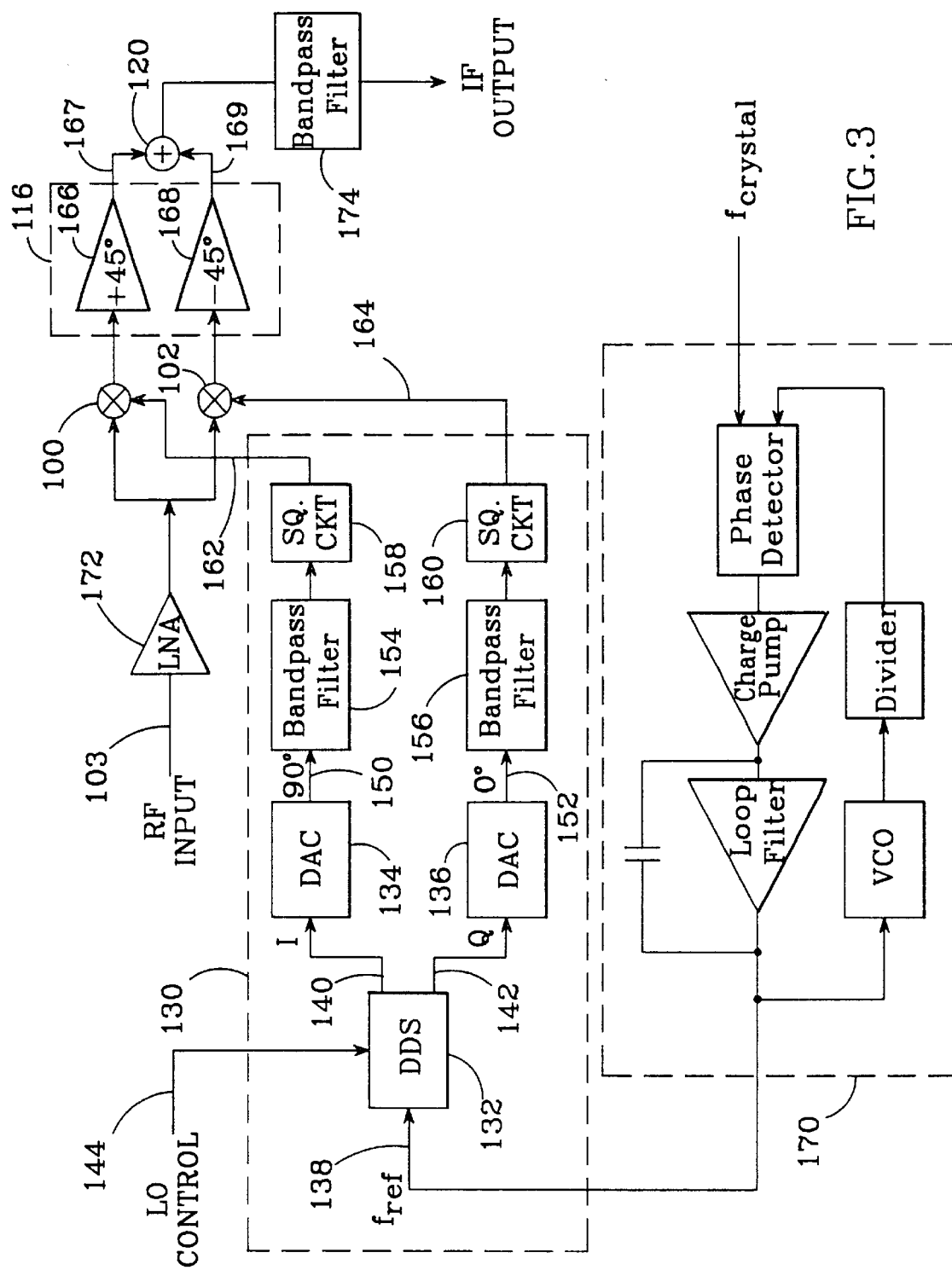
FIG. 3 is a block diagram of a preferred embodiment of a receiver front-end per the present invention.

This is illustrated in the preferred embodiment of the invention shown in FIG. 3. The outputs 140 and 142 of DDS 132 drive DACs 134 and 136, respectively, to produce quadrature sinusoidal outputs 150 and 152. The sinusoidal outputs 150 and 152 may be bandpass filtered via filters 154 and 156, respectively, before they are delivered to squaring circuits 158 and 160. Circuits 158 and 160 produce 90° and 0° square wave LO signals 162 and 164, which are delivered to mixers 100 and 102, respectively.

In some applications, bandpass filters 154 and 156 may not be necessary, depending on the spectral purity of DACs 134 and 136 and the requirements of the receiver. If the DACs are sufficiently spectrally pure, or their non-linearities have been reduced via trimming or calibration (discussed below), bandpass filters 154 and 156 may be eliminated. Bandpass filters 154 and 156 may employ passive or active filtering.

Squaring circuits 158 and 160 reduce the gain mismatch which may exist between DACs 134 and 136, but may introduce their own gain and/or phase mismatch. However, this mismatch may also be reduced by calibrating the front-end (discussed below).

Phase shift network 116 is preferably implemented with two phase shift circuits: a circuit 166 connected to phase shift the output of mixer 100 by +45° at its output 167, and a circuit 168 connected to phase shift the output of mixer 102 by −45° at its output 169. In combination, phase shift circuits 166 and 168 introduce a 90° phase difference between the outputs of the two mixers, and the phase-shifted outputs 167, 169 are summed together with summing circuit 120. The phase shift circuits 166, 168 provide image rejection for the front-end; one method of implementing this technique to provide active image rejection is described in co-pending patent application Ser. No. 09/220,288, which is assigned to the present assignee. Active image rejection tends to provide faster frequency-hopping and is thus preferred; however, passive image rejection techniques may also be employed.

DDS 132 receives clock signal $f_{ref}$ at its clock input 138. Clock signal $f_{ref}$ is preferably provided by a PLL circuit 170. PLL circuit 170 receives the output $f_{crystal}$ of an oscillator which operates on the order of 10 MHz or some other low frequency reference, and multiplies it up to the frequency required by the DDS, which is typically on the order of 1–10 GHz. Because PLL circuit 170 provides a single output frequency $f_{ref}$, it can be narrowband and thus provide a low phase noise output. When so implemented, the phase noise of DACs 134 and 136 is limited only by the process technology used; bipolar DACs are preferred, as they tend to provide superior phase noise characteristics. Note that the PLL circuit shown in FIG. 3 is merely exemplary; a wide variety of PLL circuits could be employed to provide $f_{ref}$. Further note that it is not essential that a PLL circuit be used to provide $f_{ref}$; other frequency generating circuits capable of providing a highly stable and accurate reference at the frequency required by the application may also be used.

The preferred embodiment of the present front-end also includes a low noise amplifier (LNA) 172 which amplifies the RF input signal before feeding it to mixers 100 and 102. The embodiment also preferably includes an active or passive bandpass filter 174 to serve as an anti-aliasing filter for the IF output of summing circuit 120.

Figure 4:
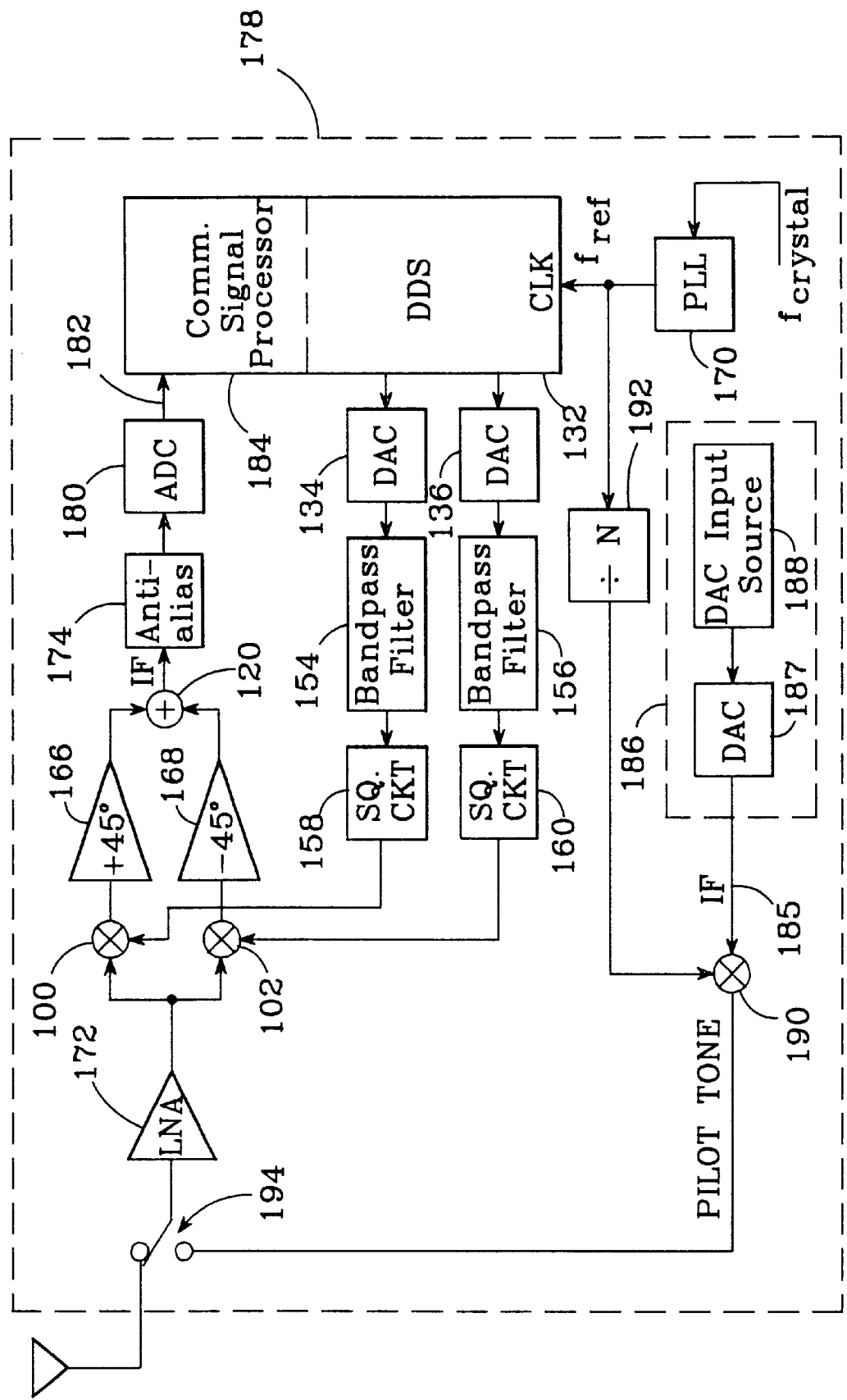
FIG. 4 is a block diagram of a system which includes a receiver front-end per the present invention and a pilot tone generation circuit for calibrating the front-end.

The present front-end can be combined with other components to provide a complete system. Such a system 178 is shown in FIG. 4. Added to the front-end of FIG. 3 is an analog-to-digital converter (ADC) 180, which converts the IF output from filter 174 to a sequence of digital words. The output 182 of ADC 180 is provided to a communications signal processor 184, which provides the command signal to DDS 132 necessary to effect the necessary frequency-hopping and typically includes algorithms used to analyze and demodulate the received signal. In this application, the receiver is used in a communications system which employs frequency-hopping. The communications signal processor 184 contains the communication system's frequency-hopping schedule, and sends commands to DDS 132 as necessary to implement the schedule.

The system can also include components which generate a fixed, high-frequency pilot tone that is used to calibrate gain and phase errors for the front-end's LO and IF paths. An IF signal 185 is generated with a circuit 186 which comprises, for example, a DAC 187 which receives one or more sequences of digital words from a source 188, such as a ROM-based look-up table, to provide one or more IF reference frequencies. The IF output 185 is fed to one input of a mixer 190, which also receives the divided down output of PLL circuit 170 via a divide-by-N counter 192 (counter 192 might alternatively be part of PLL circuit 170 itself). The output of mixer 190 is the pilot tone, the frequency $F_{pilot}$ of which is given by $f_{ref}/N+IF$. The pilot tone is fed through the front-end via a switch 194, and communications signal processor 184 analyzes the output of ADC 180 to detect gain and phase errors. Communications processor 184 uses FFTs or an equivalent method to determine necessary gain and phase corrections with respect to image rejection for each LO and pilot tone frequency. These corrections are stored in a look-up table, for example, which is addressed for each LO frequency generated to ensure that the digital word sequences produced by DDS 132 are corrected for gain and phase errors.

The calibration technique described above is discussed in more detail in co-pending patent application Ser. No. 08/903,807, now U.S. Pat. No. 6,118,811, which is assigned to the present assignee. Note that this calibration technique is but one possible method for calibrating the front-end described herein.

When active image rejection and filtering is employed, the components making up the front-ends of either FIG. 2 or FIG. 3 can be integrated together on a common substrate. Similarly, the ADC 180, communications signal processor 184, and the pilot tone generation circuit shown in FIG. 4 can be integrated with the front-end components on a common substrate to provide a complete system-on-a-chip (SOC).

While particular embodiments of the invention have been shown and described, numerous variations and alternate embodiments will occur to those skilled in the art. Accordingly, it is intended that the invention be limited only in terms of the appended claims.

We claim:

1. A wideband fast-hopping receiver front-end, comprising:

a first mixer which receives a radio frequency (RF) signal at a first input, a first wideband local oscillator (LO) signal at a second input, and which produces an output which includes components derived from the sum of its two input signals and from the difference of its two input signals, a second mixer which receives said RF signal at a first input, a second wideband LO signal at a second input, and which produces an output which includes components derived from the sum of its two input signals and from the difference of its two input signals, at least one intermediate frequency (IF) phase shift circuit connected in series with at least one of said mixer outputs to introduce a phase difference of 90 degrees between said mixer outputs, a summing circuit which sums said mixer outputs having a phase difference of 90 degrees between them to provide an intermediate frequency (IF) output, and a wideband I/Q LO generating circuit connected to provide said first and second wideband LO signals to said mixers and to enable wideband image rejection over a wide range of RF signal frequencies, said wideband I/Q LO generating circuit comprising:

a direct digital synthesis (DDS) circuit which stores multiple pairs of digital word sequences, receives a clock signal and a command signal at first and second inputs, respectively, and selects one of said stored digital word sequence pairs to be produced at first and second outputs in response to said command and clock signals, each of said stored digital word sequence pairs representing first and second periodic waveforms having a particular frequency and a phase difference of 90 degrees between them, a first digital-to-analog converter (DAC) which receives said first output from said DDS at an input and which produces said first periodic waveform at an output, said first periodic waveform being said first wideband LO signal, and a second digital-to-analog converter (DAC) which receives said second output from said DDS at an input and which produces said second periodic waveform at an output, said second periodic waveform being said second wideband LO signal.

2. The receiver front-end of claim 1, wherein said first and second mixers are Gilbert mixers.

3. The receiver front-end of claim 1, wherein said at least one IF phase shift circuit comprises a first phase shift circuit arranged to phase shift the output of said first mixer by +45 degrees and a second phase shift circuit arranged to phase shift the output of said second mixer by −45 degrees, the outputs of said first and second phase shift circuits being summed by said summing circuit to provide said IF output.

4. The receiver front-end of claim 1, wherein said DDS is arranged such that said stored digital word sequence pairs represent respective first and second square wave waveforms.

5. The receiver front-end of claim 1, wherein said DDS is arranged such that said stored digital word sequence pairs represent respective first and second sinusoidal waveforms, further comprising a pair of squaring circuits connected between said DAC outputs and said mixers' LO inputs to provide square wave LO signals to said mixers.

6. The receiver front-end of claim 1, further comprising a pair of bandpass filters connected between said DAC outputs and said mixers' LO signal inputs and a bandpass filter connected to filter the IF output of said summing circuit.

7. The receiver front-end of claim 6, wherein said bandpass filters are active filters.

8. The receiver front-end of claim 1, further comprising a low noise amplifier (LNA) connected between said RF signal and said mixers' RF signal inputs.

9. The receiver front-end of claim 1, further comprising a phase-locked loop circuit which receives an oscillator signal at an input and which produces said clock signal.

10. A wideband fast-hopping receiver front-end, comprising:

a first mixer which receives a radio frequency (RF) signal at a first input, a first wideband local oscillator (LO)

signal at a second input, and which produces an output which includes components derived from the sum of its two input signals and from the difference of its two input signals, a second mixer which receives said RF signal at a first input, a second wideband LO signal at a second input, and which produces an output which includes components derived from the sum of its two input signals and from the difference of its two input signals, a first intermediate frequency (IF) phase shift circuit connected in series with said first mixer output and arranged to phase shift said first mixer output by +45 degrees, a second IF phase shift circuit connected in series with said second mixer output and arranged to phase shift said second mixer output by −45 degrees, a summing circuit which sums the outputs of said first and second phase shift circuits to provide an if output, and a wideband I/Q LO generating circuit connected to provide said first and second wideband LO signals to said mixers and to enable wideband image rejection over a wide range of RF signal frequencies, said wideband I/Q LO generating circuit comprising:
  a clock generation circuit which generates a clock signal,
  a direct digital synthesis (DDS) circuit which stores multiple pairs of digital word sequences, receives said clock signal and a command signal at first and second inputs, respectively, and selects one of said stored digital word sequence pairs to be produced at first and second outputs in response to said command and clock signals, each of said stored digital word sequence pairs representing first and second sinusoidal waveforms having a particular frequency and a phase difference of 90 degrees between them,
  a first digital-to-analog converter (DAC) which receives said first output from said DDS at an input and which produces said first sinusoidal waveform at an output,
  a first squaring circuit connected to receive the output of said first DAC at an input and to provide said first wideband LO signal to said first mixer,
  a second digital-to-analog converter (DAC) which receives said second output from said DDS at an input and which produces said second sinusoidal waveform at an output, and
  a second squaring circuit connected to receive the output of said second DAC at an input and to provide said second wideband LO signal to said second mixer.

11. The receiver front end of claim 10, further comprising a pair of bandpass filters connected between said DAC outputs and said mixers' LO signal inputs and a bandpass filter connected to filter the IF output of said summing circuit.

12. The receiver front-end of claim 10, wherein said clock generation circuit comprises a phase-locked loop circuit which receives an oscillator signal at an input and which produces said clock signal at an output.

13. The receiver front-end of claim 10, further comprising:
  an analog-to-digital (ADC) converter connected to receive said IF output at an analog input and to produce a digital output, and
  a communications signal processor connected to receive said ADC's digital output at an input and arranged to produce said command signal to said DDS such that the frequency of said LO signals changes with the frequency of said RF signal.

14. The receiver front-end of claim 13, further comprising an anti-aliasing filter connected to filter said IF output prior to its application to said ADC's analog input.

15. The receiver front-end of claim 13, wherein said mixers, phase shift circuits, summing circuit and LO generating circuit are integrated together on a common substrate.

16. The receiver front-end of claim 13, wherein said communications signal processor includes a look-up table which contains correction values for modifying said DDS's digital output word sequences, said communications signal processor arranged to address a set of correction values in said look-up table for each LO frequency generated.

17. A wideband fast-hopping receiver front-end, comprising:
  a first mixer which receives a radio frequency (RF) signal at a first input, a first wideband local oscillator (LO) signal at a second input, and which produces an output which includes components derived from the sum of its two input signals and from the difference of its two input signals;
  a second mixer which receives said RF signal at a first input, a second wideband LO signal at a second input, and which produces an output which includes components derived from the sum of its two input signals and from the difference of its two input signals;
  a first intermediate frequency (IF) phase shift circuit connected in series with said first mixer output and arranged to phase shift said first mixer output by +45 degrees;
  a second IF phase shift circuit connected in series with said second mixer output and arranged to phase shift said second mixer output by −45 degrees;
  a summing circuit which sums the outputs of said first and second phase shift circuits to provide an IF output;
  a wideband I/Q LO generating circuit connected to provide said first and second wideband LO signals to said mixers and to enable wideband image rejection over a wide range of RF signal frequencies, said wideband I/Q LO generating circuit comprising
    a clock generation circuit which generates a clock signal,
    a direct digital synthesis (DDS) circuit which stores multiple pairs of digital word sequences, receives said clock signal and a command signal at first and second inputs, respectively, and selects one of said stored digital word sequence pairs to be produced at first and second outputs in response to said command and clock signals, each of said stored digital word sequence pairs representing first and second sinusoidal waveforms having a particular frequency and a phase difference of 90 degrees between them,
    a first digital-to-analog converter (DAC) which receives said first output from said DDS at an input and which produces said first sinusoidal waveform at an output,
    a first squaring circuit connected to receive the output of said first DAC at an input and to provide said first LO signal to said first mixer,
    a second digital-to-analog converter (DAC) which receives said second output from said DDS at an input and which produces said second sinusoidal waveform at an output, and a second squaring circuit connected to receive the output of said second DAC at an input and to provide said second LO signal to said second mixer;

an analog-to-digital (ADC) converter connected to receive said IF output at an analog input and to produce a digital output;

a communications signal processor connected to receive said ADC's digital output at an input and arranged to produce said command signal to said DDS such that the frequency of said LO signals changes with the frequency of said RF signal;

a pilot tone DAC which generates an IF frequency at its analog output in response to a sequence of digital words applied to its digital input, a pilot tone DAC input source which stores and applies one or more sequences of digital words to said pilot tone DAC's digital input, a divide-by-N counter connected to divide down the frequency of said clock signal, and a mixer which receives said pilot tone DAC's IF frequency output at a first input and said counter's divided down clock signal at a second input and produces an RF pilot tone which varies with its first and second inputs at an output, said pilot tone connected to the first inputs of said first and second mixers to determine gain and phase errors in said front-end which appear in said IF output, said communications signal processor arranged to modify said DDS's digital output word sequences as necessary to reduce said gain and phase errors.

18. The receiver front-end of claim 17, wherein said pilot tone DAC input source is a look-up table that contains at least one sequence of digital words for generating a respective pilot tone frequency.

19. A method of mixing a frequency-hopping RF input signal, comprising:

generating in-phase and quadrature wideband local oscillator (LO) signals, said generating of said signals accomplished by:

storing multiple pairs of sequences of digital words, each of which represents an in-phase and quadrature LO waveform at a particular frequency, outputting a pair of said digital word sequences which represent in-phase and quadrature LO waveforms at a desired frequency in response to a command signal, converting said outputted pair of digital word sequences to analog waveforms, said analog waveforms being said in-phase and quadrature LO waveforms at a desired frequency, mixing said in-phase wideband LO signal with an RF input signal, mixing said quadrature wideband LO signal with said RF input signal, phase shifting at least one of said mixed signals at intermediate frequencies (IF) to provide a phase difference of 90 degrees between said mixed signals, and summing said mixed signals which are separated by 90 degrees to provide an IF output, wherein the generation of in-phase and quadrature wideband LO signals enables wideband image rejection over a wide range of RF input signal frequencies.

20. The method of claim 19, further comprising the step of bandpass filtering said analog waveforms before mixing them with said RF input signal.

21. The method of claim 19, further comprising the step of squaring up said analog waveforms before mixing them with said RF input signal.

22. The method of claim 19, wherein said phase shifting comprises phase shifting one of said mixed signals by +45 degrees and phase shifting the other of said mixed signals by −45 degrees to provide said phase difference of 90 degrees between said mixed signals.

* * * * *